United States Patent [19]

Han et al.

[11] Patent Number: 5,367,491
[45] Date of Patent: Nov. 22, 1994

[54] APPARATUS FOR AUTOMATICALLY INITIATING A STRESS MODE OF A SEMICONDUCTOR MEMORY DEVICE

[75] Inventors: Jin-Man Han, Chuncheon; Jong-Hoon Lee, Suwon, both of Rep. of Korea

[73] Assignee: Samsung Electronics, Co., Ltd., Kyungki, Rep. of Korea

[21] Appl. No.: 825,947

[22] Filed: Jan. 27, 1992

[30] Foreign Application Priority Data

Aug. 23, 1991 [KR] Rep. of Korea ............... 1991-14663

[51] Int. Cl.$^5$ ............................................. G11C 7/00
[52] U.S. Cl. ............................. 365/201; 365/189.07; 327/62; 327/72
[58] Field of Search .......... 365/201, 207, 208, 189.07, 365/189.09, 189.03; 307/355, 359, 296.1; 371/28; 330/259, 290

[56] References Cited

U.S. PATENT DOCUMENTS

| | | | |
|---|---|---|---|
| 4,910,455 | 3/1990 | Nadd | 307/359 X |
| 4,999,521 | 3/1991 | Rusznyak | 307/359 X |
| 5,087,834 | 2/1992 | Tsay | 307/359 X |
| 5,132,560 | 7/1992 | Kane | 307/355 |
| 5,134,587 | 7/1992 | Steele | 365/201 |

*Primary Examiner*—Eugene R. LaRoche
*Assistant Examiner*—Christopher R. Glembocki
*Attorney, Agent, or Firm*—Hecker & Harriman

[57] ABSTRACT

In a highly integrated semiconductor memory device, apparatus for setting a stress mode without applying a stress voltage from the exterior is provided. A triggered time point $T_S$ to a stress mode can be set by greatly raising an internal supply voltage when the external supply voltage is raised to a voltage over the stress voltage.

8 Claims, 3 Drawing Sheets

APPARATUS FOR AUTOMATICALLY INITIATING A STRESS MODE OF A SEMICONDUCTOR MEMORY DEVICE

BACKGROUND OF THE PRESENT INVENTION

1. Field of the Invention

The present invention relates to the initiating of a stress mode in a semiconductor memory device, and more particularly to an apparatus for testing a stress mode in a semiconductor memory device using an internal voltage drop circuit.

2. Background Art

In a high-integration semiconductor memory memory device, an internal voltage drop circuit is employed for reducing an externally applied voltage down to a predetermined internal voltage value for use in the interior of the semiconductor memory device. According to the level of the external voltage, the internal voltage drop circuit causes a semiconductor memory chip to operate in either a normal operating mode, or a stress mode for testing the reliability of the memory chip. If the memory chip is in the stress mode, the supply voltage becomes approximately 6 V to 7 V, whereas in the normal mode, a supply voltage of 5 V is used. In the stress mode case, the access time becomes shorter in comparison with the case for the normal operating mode.

As an apparatus for simply sensing the stress mode, a voltage drop circuit constructed with voltage drop devices, such as resistors, diodes or MOS transistors, connected between an input pad and a ground voltage terminal, is used. That is, the stress mode is sensed using the voltage state of a node connecting the input pad to the voltage drop circuit. If the voltage at this node has a potential high enough to turn on the voltage drop circuit, the potential of a sensing node enters a logical "low" state (in this case, the stress mode), otherwise the potential of the sensing node enters a logical "high" state (in this case, the normal mode), thus sensing the mode pattern of the semiconductor chip. However, this system has a disadvantage in that the sensing speed of the stress voltage is relatively slow.

FIG. 1 shows a conventional test circuit for the stress mode. The stress mode is set by directly applying the stress voltage to an input pad 1. In the normal mode, since the potential of node 2 is reduced from an external supply voltage $XV_{CC}$, by the threshold voltage value of a diode-connected NMOS transistor Q2, PMOS transistor Q3, having a gate connected to receive an external supply voltage $XV_{CC}$, is turned off. Whereas, NMOS transistors Q4 and Q5, with gates connected to receive the external supply voltage $XV_{CC}$, are turned on. Accordingly, since the potential of sensing node 3 is in a logical "low" state and the output of bias circuit 4 is in a logical "high" state, PMOS transistor Q6 is turned off. However, if the stress voltage is applied to the input pad 1, the potential of node 2 becomes the potential obtained by subtracting the threshold voltage of NMOS transistor Q1 from the applied stress voltage. Since the potential at node 2 that is caused by the stress voltage is higher than the external supply voltage $XV_{CC}$ applied to the gate of PMOS transistor Q3, PMOS transistor Q3 is turned on. Consequently, the output voltage of bias circuit 4 is in a logical "low" state, and the internal supply voltage $IV_{CC}$ enters a logical "high" state. That is, the internal circuit senses the stress test mode. Thereafter, the internal supply voltage $IV_{CC}$ rises in a manner dependent upon the external supply voltage $XV_{CC}$, actually $XV_{CC}-2V_{TH}$, as shown in FIG. 4. In this case, it should be noted that the current driving capability of PMOS transistor Q3 is relatively higher than the current driving capability of NMOS transistors Q4 and Q5.

For this system, in order to perform the stress test mode, the stress voltage must be applied from the exterior. This is inconvenient to the user. Moreover, after the stress voltage is applied, since the internal supply voltage $IV_{CC}$ rises, dependent upon the external supply voltage $XV_{CC}$ as shown in FIG. 4, it is difficult to accurately find the point in time at which the internal supply voltage $IV_{CC}$ reaches the level of the stress test mode.

SUMMARY OF THE PRESENT INVENTION

In accordance with the present invention, a circuit for initiating a stress test mode of a semiconductor memory device that uses an external supply voltage and an internal supply voltage comprises a first voltage node having a first potential dependent upon the internal supply voltage, a second voltage node having a second potential dependent upon the external supply voltage, a differential amplifier connected to receive the first and second potentials of the first and second voltage nodes, an insulation gate field effect transistor having a gate connected to an output node of the differential amplifier, a charging node connected to one terminal of a channel of the insulation gate field effect transistor and having a third potential dependent upon the external supply voltage, and a trigger node connected to the other terminal of the channel of the insulation gate field effect transistor.

BRIEF DESCRIPTION OF THE DRAWINGS

These and other features of the invention will be understood from the following description of illustrative embodiments, with reference to the drawings, in which.

DETAILED DESCRIPTION OF THE INVENTION

Figure 1:
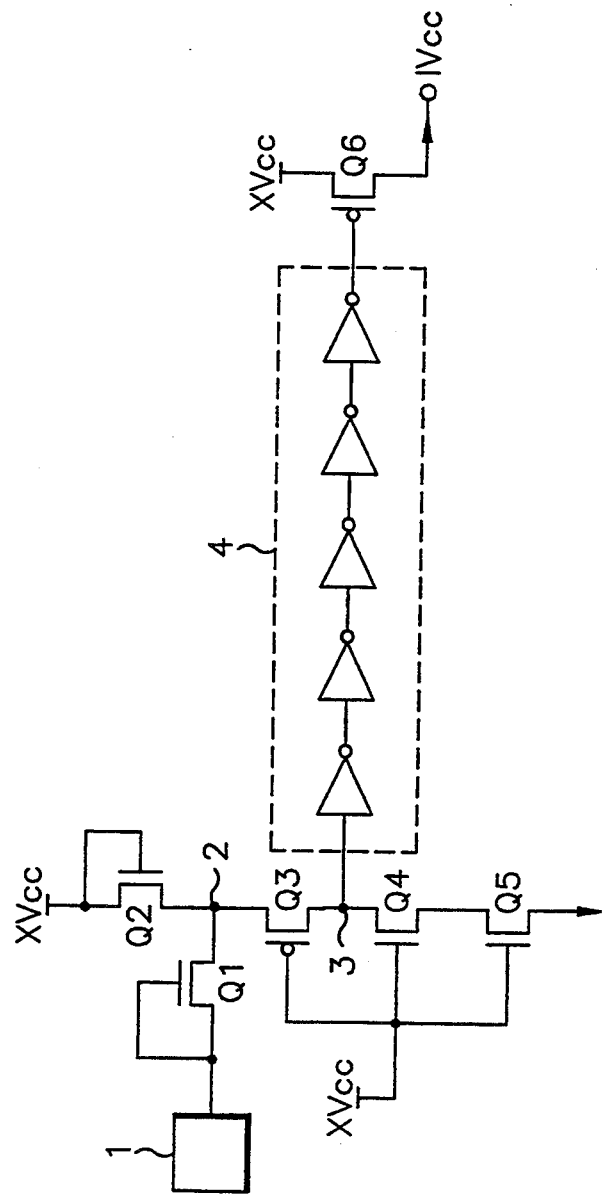
FIG. 1 is a circuit diagram illustrating a conventional test apparatus for a stress mode.
Figure 2:
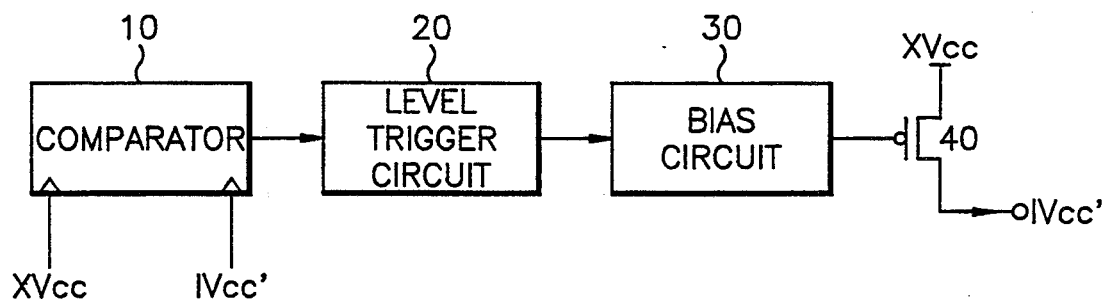
FIG. 2 is a block diagram according to the present invention.

Referring to FIG. 2, an apparatus for initiating the stress mode is comprised of a comparator 10 for comparing the internal supply voltage $IV_{CC}$ with the external supply voltage $XV_{CC}$ and for amplifying the voltage difference between the internal supply voltage $IV_{CC}$ and the external supply voltage $XV_{CC}$, a level trigger circuit 20 being operated according to the output of comparator 10, a bias circuit for setting the potential of the output voltage signal of the level trigger circuit 20 to a given level, and a PMOS transistor 40 that is driven dependent upon the output potential of bias circuit 30.

Figure 3:
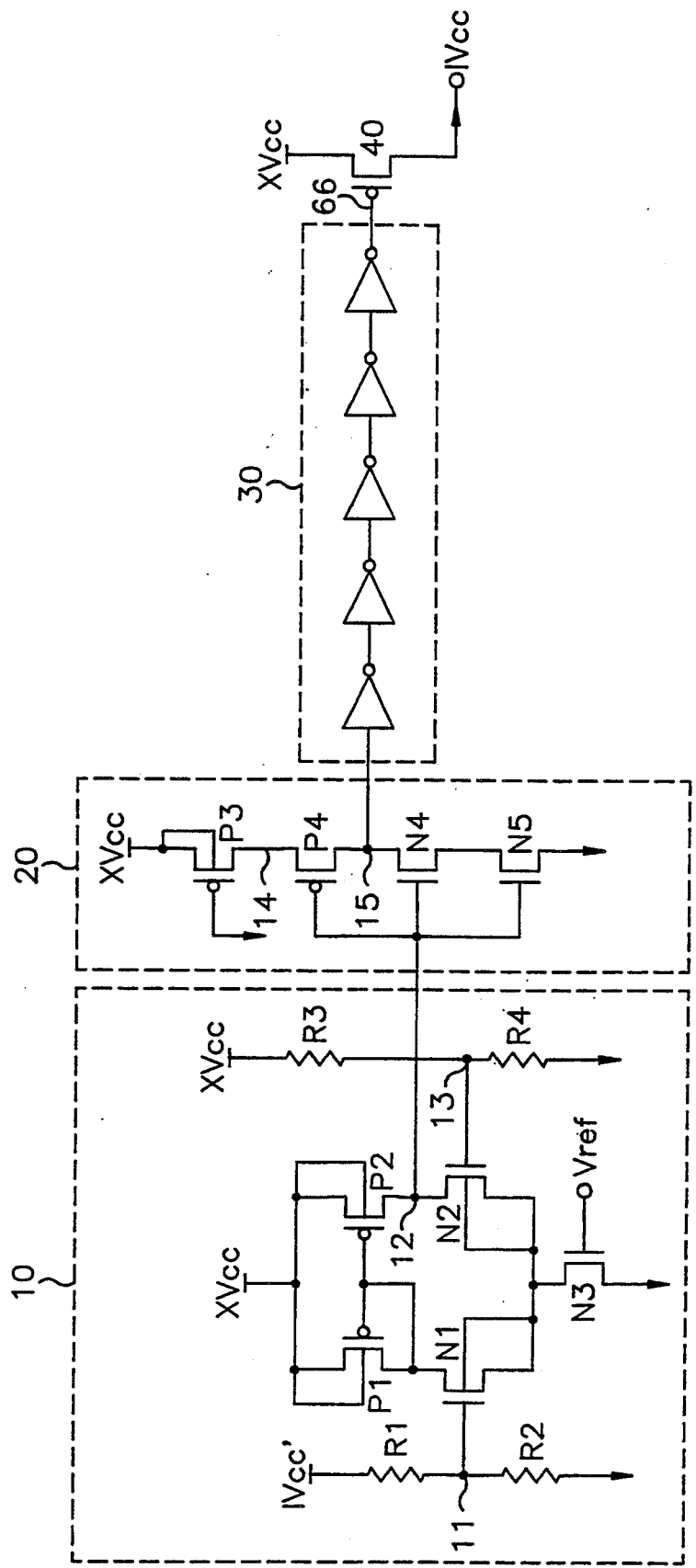
FIG. 3 is a circuit diagram illustrating one preferred embodiment of FIG. 2.

FIG. 3 shows a circuit diagram illustrating one preferred embodiment of FIG. 2. If the internal supply voltage $IV_{CC}$ is divided by resistors R1 and R2, the potential of a first voltage node 11, positioned between the resistors R1 and R2, is (178 ) $V_{CC}$. In this embodiment, the resistance values of the resistors R1 and R2 are identical to each other. Also, the external supply voltage $XV_{CC}$ is divided by resistors R3 and R4, and a potential of (178)$XV_{CC}$ is generated at a second voltage node 13 positioned between resistors R3 and R4. In this case, resistors R3 and R4 also have equal resistance values.

The first and second voltage nodes 11 and 12 represent two input nodes of an N-channel input differential amplifier constructed with PMOS transistors P1 and P2, and with NMOS transistors N1, N2 and N3. The sources of PMOS transistors P1 and P2 are commonly connected to the external supply voltage $XV_{CC}$. The gate of NMOS transistor N3 is connected to receive a reference voltage, $V_{REF}$, for enabling the differential amplifier. One terminal of the channel of NMOS transistor N3 is connected to a ground voltage, $V_{SS}$. An output voltage signal of the differential amplifier is applied to the level trigger circuit 20. Level trigger circuit 20 is comprised of PMOS transistor P4 and NMOS transistors N4 and N5, each having a gate terminal connected to output node 12 of the differential amplifier, and PMOS transistor P3 with a channel connected between the external supply voltage $XV_{CC}$ and the source terminal of PMOS transistor P4. The gate of transistor P3 is connected to the ground voltage $V_{SS}$. PMOS transistor P4 and NMOS transistors N4 and N5 are serially connected to the ground voltage $V_{SS}$. The drain terminals of PMOS transistor P4 and NMOS transistor N4 form a trigger node 15. Trigger node 15 is connected to an input terminal of the bias circuit 30. In the above construction, the resistors R1 to R4 can be replaced with diodes or MOS transistors.

Figure 4:
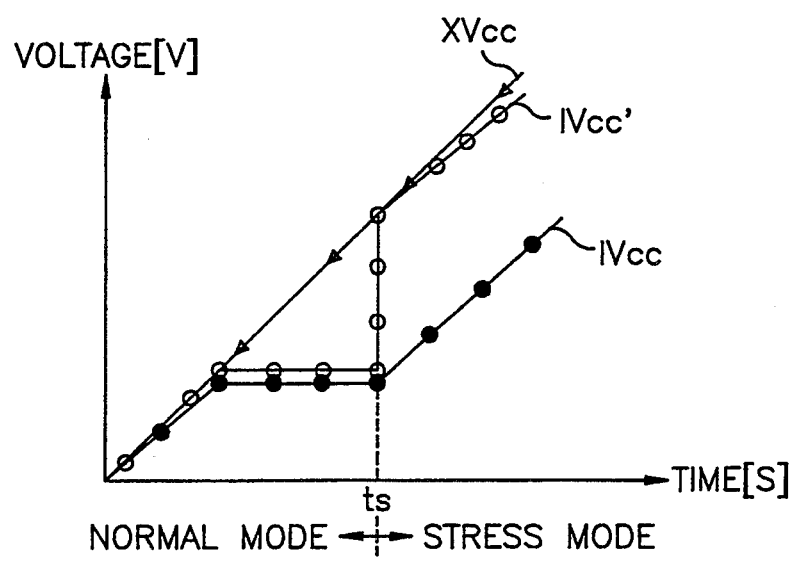
FIG. 4 is a graph comparing internal voltage waveforms of FIG. 1 with that of FIG. 3.

Referring to FIGS. 3 and 4, as the external supply voltage $XV_{CC}$ rises, the potential of the second voltage node 13 becomes higher than that of the first voltage node 11, and the current flowing into the ground voltage $V_{SS}$ through NMOS transistors N2 and N3 increases. Accordingly, the potential of the output node 12 is reduced. Meanwhile, the potential of the source of PMOS transistor P4 of the level trigger circuit is at a logical "high", i.e. charging node 14 is charged with the potential of the external supply voltage $XV_{CC}$ by PMOS transistor P3, which is normally turned on.

When the external supply voltage $XV_{CC}$ reaches the stress voltage (approximately 6 to 7 V), the potentials of output node 12 and charging node 14 provide a condition in which PMOS transistor P4 can be turned on. The voltage of the output node 12 provides a gate voltage, $V_G$, to PMOS transistor P4, and the voltage of charging node 14 provides a source voltage, $V_S$, to PMOS transistor P4. For the case where the threshold voltage of PMOS transistor P4 is $-1V$, when the source voltage, $V_S$, is approximately 7 V and the gate voltage $V_G$ is less than 6 V, the voltage between the gate and source, $V_{GS}$, is less than $-1$ V, thereby turning on the PMOS transistor P4. Thus, the trigger node 15 of the level trigger circuit 20 becomes a logical "high". At this time, time point "$T_S$", the internal supply voltage $IV_{CC}$, is greatly increased. The stress voltage appears as shown in FIG. 4. Thereafter, the internal supply $IV_{CC}$ is increased in a manner dependent upon the external supply voltage $XV_{CC}$. In this case, it should be noted that the current driving capability of the PMOS transistor P4 is relatively higher than the current driving capability of NMOS transistors N4 and N5. Consequently, the trigger node 15 can be rapidly switched to the stress mode by a sudden increase of the internal supply voltage $IV_{CC}$ at the time point $T_S$. This is because the potential at the output node 12 of the differential amplifier is reduced as much as the potential of the external supply voltage $XV_{CC}$ is raised. In addition, the voltage at charging node 14 increases as the external supply voltage $XV_{CC}$ increases. The voltage at charging node 14 is applied to the source of PMOS transistor P4. Transistor P4 is utilized to perform a practical trigger operation. It should be appreciated that when the external supply voltage $XV_{CC}$ is raised to the stress voltage, the momentary pull-up function of the PMOS transistor P4 is strongly driven.

As described above, according to the present invention, the stress mode can be automatically set without applying the stress voltage from the exterior. Moreover, when the external supply voltage reaches the stress voltage, the triggered time point of the stress mode can be accurately obtained.

While the present invention has been particularly shown and described with reference to the preferred embodiment thereof, it will be understood by those skilled in the art that changes in form and details may be made without departing from the spirit and scope of the present invention.

We claim:

1. A circuit for initiating a stress mode of a semiconductor memory device using an external supply voltage and an internal supply voltage, comprising:
    a differential amplifier connected to receive said external supply voltage and said internal supply voltage;
    a level trigger circuit connected to receive an output of said differential amplifier;
    a bias circuit connected to receive an output of said level trigger circuit; and
    a driving insulation gate field effect transistor receiving an output of said bias circuit through a gate thereof, said driving insulation gate field effect transistor having a channel connected between said external supply voltage and said internal supply voltage.

2. The circuit as claimed in claim 1, wherein said level trigger circuit is comprised of:
    an insulation gate field effect transistor having a gate connected to an output terminal of said differential amplifier, and having a channel, one terminal of said channel being connected to said external supply voltage; and
    a trigger node connected to a second terminal of said channel of said insulation gate field effect transistor and coupled to an input terminal of said bias circuit.

3. A circuit for initiating a stress mode of a semiconductor memory device using an external supply voltage and an internal supply voltage, comprising:
    a first voltage node having a first potential dependent upon said internal supply voltage;
    a second voltage node having a second potential dependent upon said external supply voltage;
    a differential amplifier connected to receive said first and second potentials of said first and second voltage nodes, and having an output node;
    a first insulation gate field effect transistor having a gate connected to said output node of said differential amplifier;
    a charging node connected to one terminal of a channel of said first insulation gate field effect transistor, and having a third potential dependent upon said external supply voltage;

a trigger node connected to a second terminal of said channel of said first insulation gate field effect transistor;

a bias circuit having an input terminal connected to said trigger node; and, a second insulation gate field effect transistor connected to receive an output of said bias circuit through a gate thereof, said second insulation gate field effect transistor having a channel connected between said external supply voltage and said internal supply voltage.

4. The circuit as claimed in claim 3, wherein said first potential is connected to an output of a first voltage division means connected between said internal supply voltage and a ground voltage.

5. The circuit as claimed in claim 3, wherein said second potential is connected to an output of a second voltage division means connected between said external supply voltage and a ground voltage.

6. A circuit for initiating a stress mode of a semiconductor memory device using an external supply voltage and an internal supply voltage, comprising:

a first voltage node having a first potential dependent upon said internal supply voltage;

a second voltage node having a second potential dependent upon said external supply voltage;

a differential amplifier connected to receive said first and second potentials of said first and second voltage nodes, and having an output node;

a first insulation gate field effect transistor having a gate connected to said output node of said differential amplifier;

a charging node connected to one terminal of a channel of said first insulation gate field effect transistor, and having a third potential dependent upon said external supply voltage;

a trigger node connected to a second terminal of said channel of said first insulation gate field effect transistor;

a bias circuit having an input terminal connected to said trigger node; and, a second insulation gate field effect transistor connected to receive an output of said bias circuit through a gate thereof, said second insulation gate field effect transistor having a channel connected between said external supply voltage and said internal supply voltage.

7. The circuit as claimed in claim 6, wherein said first potential is connected to an output of a first voltage division means connected between said internal supply voltage and a ground voltage.

8. The circuit as claimed in claim 6, wherein said second potential is connected to an output of a second voltage division means connected between said external supply voltage and a ground voltage.

* * * * *